(12) United States Patent  
Chaoui

(10) Patent No.: US 6,973,106 B1  
(45) Date of Patent: Dec. 6, 2005

(54) OPTICAL PACKAGE AND OPTICAL SYSTEMS APPARATUSES, AND METHODS OF USE THEREIN

(75) Inventor: Ghazi Chaoui, Clarksville, MD (US)

(73) Assignee: Corvis Corporation, Columbia, MD (US)

( * ) Notice: Subject to any disclaimer, the term of this patent is extended or adjusted under 35 U.S.C. 154(b) by 12 days.

(21) Appl. No.: 10/269,134

(22) Filed: Oct. 11, 2002

(51) Int. Cl.$^7$ ................................................. H01S 3/04
(52) U.S. Cl. .............................. 372/34; 372/35; 372/36
(58) Field of Search ..................................... 372/34–36

(56) References Cited

U.S. PATENT DOCUMENTS

| | | | | |
|---|---|---|---|---|
| 4,803,689 A | | 2/1989 | Shibanuma | 372/36 |
| 5,163,062 A | * | 11/1992 | Moberg | 372/29.022 |
| 5,185,836 A | | 2/1993 | Baker | 385/61 |
| 5,305,336 A | | 4/1994 | Adar et al. | 372/18 |
| 5,430,820 A | | 7/1995 | Van Tongeren et al. | 385/94 |
| 5,436,920 A | | 7/1995 | Minemoto et al. | 372/21 |
| 5,446,750 A | | 8/1995 | Ohtsuka et al. | 372/34 |
| 5,446,816 A | | 8/1995 | Shiraishi et al. | 385/33 |
| 5,457,557 A | | 10/1995 | Zarem et al. | 359/121 |
| 5,760,939 A | * | 6/1998 | Nagarajan et al. | 398/140 |
| 5,845,030 A | | 12/1998 | Sasaki et al. | 385/88 |
| 6,195,372 B1 | * | 2/2001 | Brown | 372/34 |
| 6,252,726 B1 | * | 6/2001 | Verdiell | 359/820 |
| 6,584,332 B2 | * | 6/2003 | Yoshitake et al. | 505/210 |
| 6,650,667 B2 | * | 11/2003 | Nasu et al. | 372/32 |
| 6,665,328 B1 | * | 12/2003 | Henrie et al. | 372/69 |
| 6,676,306 B2 | * | 1/2004 | Ikeda et al. | 385/92 |
| 2002/0048295 A1 | * | 4/2002 | Kato et al. | 372/36 |
| 2002/0054615 A1 | * | 5/2002 | Nagamatsu et al. | 372/36 |
| 2002/0064194 A1 | * | 5/2002 | Nagamatsu | 372/34 |
| 2002/0131731 A1 | * | 9/2002 | Ikeda et al. | 385/92 |
| 2003/0067952 A1 | * | 4/2003 | Tsukiji et al. | 372/36 |
| 2003/0117771 A1 | * | 6/2003 | Owens et al. | 361/687 |
| 2003/0142712 A1 | * | 7/2003 | Ikeda et al. | 372/36 |
| 2003/0142924 A1 | * | 7/2003 | Ikeda et al. | 385/88 |
| 2003/0231667 A1 | * | 12/2003 | Byren et al. | 372/35 |
| 2004/0001717 A1 | * | 1/2004 | Bennett et al. | 398/92 |
| 2004/0032891 A1 | * | 2/2004 | Ikeda et al. | 372/43 |

* cited by examiner

*Primary Examiner*—Trinh V. Dinh  
*Assistant Examiner*—Leith Al-Nazer

(57) ABSTRACT

Optical systems of the present invention include optical devices, such as lasers and other optical sources, that are packaged, or housed, in a structure employing a high thermal conductivity, low effective thermal mass member, such as a heat pipe. The high thermal conductivity, low effective thermal mass is positioned in sufficiently close proximity to one or more optical sources that heat generated by the sources is conducted away at a desired efficiency to maintain the package within a prescribed temperature range.

17 Claims, 5 Drawing Sheets

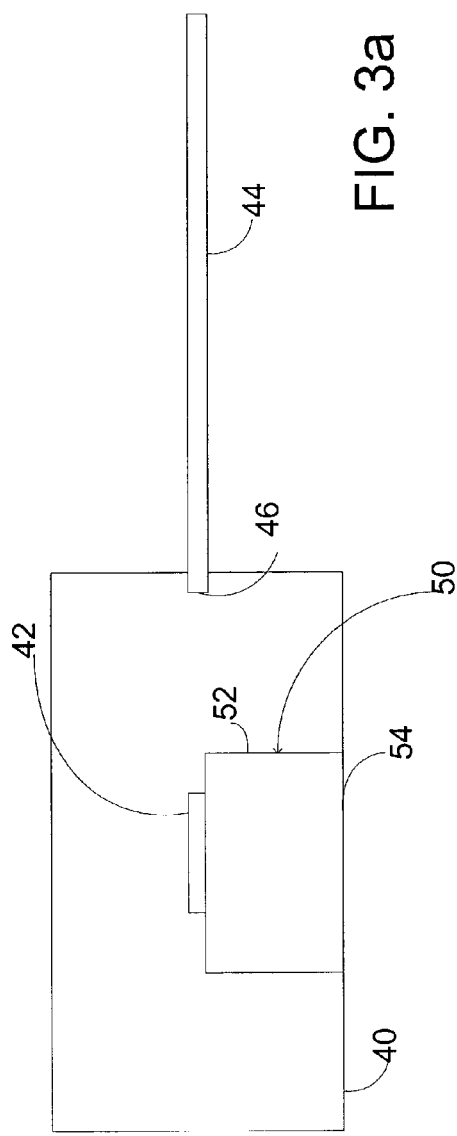
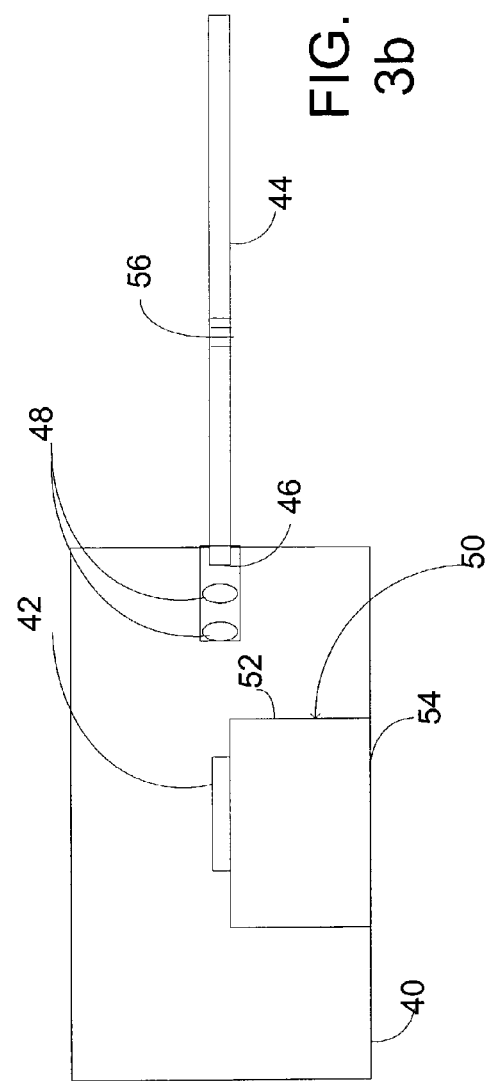

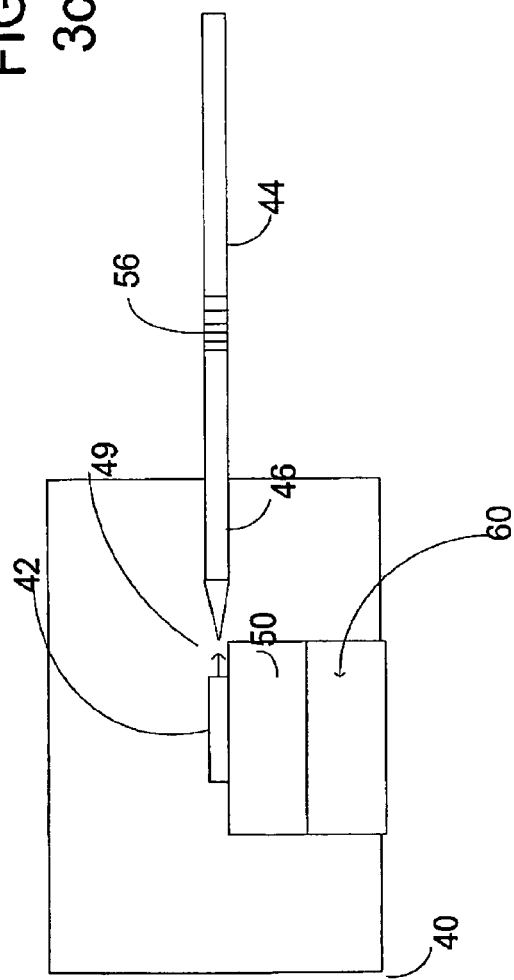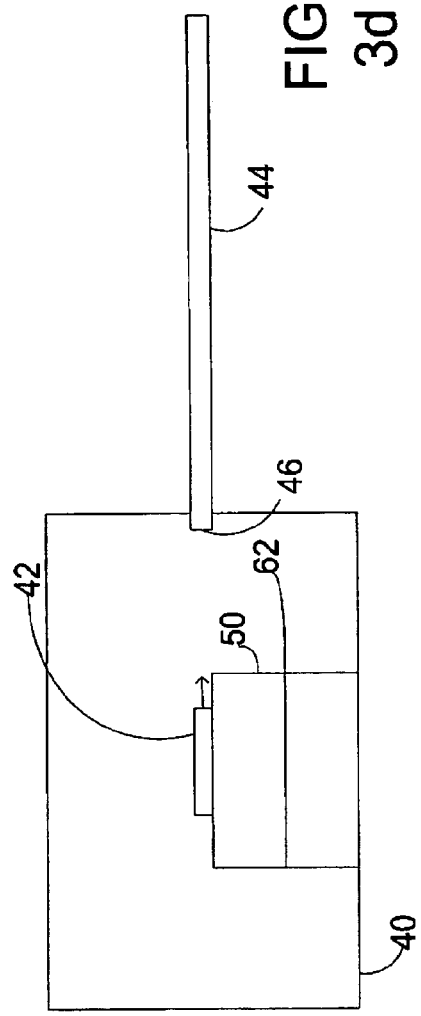

OPTICAL PACKAGE AND OPTICAL SYSTEMS APPARATUSES, AND METHODS OF USE THEREIN

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention is directed generally to optical packaging. More particularly, the invention relates to packages and packaging methods for optical sources, such as lasers, light emitting diodes, and other optical/electrical components and modules for use in optical systems, e.g., optical communication systems.

The continued growth in traditional communications systems and the emergence of the Internet as a means for accessing and communicating information has accelerated demand for high capacity communications networks. Telecommunications service providers, in particular, have looked to wavelength division multiplexed ("WDM") transmission systems to increase the capacity of their optical fiber networks to meet the increasing demand.

In WDM transmission systems, distinct wavelength ranges that are useful for transmission through a transmission medium are allocated to carry separate information streams simultaneously within the medium. Analogously, distinct frequency ranges can be allocated to carry separate information streams in frequency division multiplexed ("FDM") systems. The wavelength/frequency ranges of WDM, FDM, and other systems carrying multiple information streams are often referred to signal wavelengths/frequencies, or signal channels. The ranges are characterized by a center wavelength/frequency, which is typically the mid-point of the wavelength/frequency range. The ranges also may be characterized in other manners, such as the wavelength/frequency of maximum power or a relative to reference wavelength/frequency.

In WDM systems, signal channels are transmitted using electromagnetic waves within the distinct wavelength ranges in the optical spectrum, typically in the infrared wavelength range. Each signal channel can be used to carry a single information stream or multiple information streams that are electrically or optically time division multiplexed ("TDM") together into a TDM information stream.

The pluralities of information carrying wavelengths are combined optically into a multiple channel, "WDM", optical signal that is transmitted in a single waveguide. In this manner, WDM and other multiple channel systems can increase the transmission capacity of space division multiplexed ("SDM"), i.e., single channel, optical systems by a factor equal to the number of channels in the multiple channel system.

The development of optical amplifiers greatly reduced the cost of optical systems, and WDM systems in particular. Optical amplifiers provide the ability to amplify multiple optical signals simultaneously, which essentially eliminating the need to separate and repeat each signal electrically merely to overcome signal attenuation.

While the development of optical amplifiers has greatly reduced the equipment costs associated with amplifiers in optical systems, there remains operational problems that must be addressed. A failure in an optical amplifier could prevent any of the optical signals from passing through the amplifier and the system.

Optical source failures that occur in optical systems often result from a failure of some other components associated with source. For example, thermo-electric coolers ("TEC") are often used to allow for active temperature of an optical source. However, TEC can have an unacceptably high failure rate that makes TEC unsuitable for applications that require high reliability, such as mission critical or undersea applications. Alternative designs developed to eliminate the need for a TEC require specialty packaging that substantially increases the cost of the devices. For example, the optical source, e.g. a semiconductor laser, has to be mounted on a structural surface of a package to provide sufficient heat conduction to eliminate the need for a TEC. These designs further require expensive specialty optical coupling devices, such as lensed fibers, to couple the optical power out of the package, which drive up the cost of higher reliability devices. As such, there is a need for optical devices to address the problems of cost and reliability in optical communication systems.

BRIEF SUMMARY OF THE INVENTION

The systems, apparatuses, and methods of the present invention address the aforementioned problems and the need for improved optical devices, systems, apparatuses and methods for use therein. Optical systems of the present invention include optical devices, such as lasers, light emitting diodes, and other optical sources, that are packaged, or housed, in a structure employing a high thermal conductivity, low effective thermal mass ("HTC/LTM") member, such as a heat pipe. The HTC/LTM material is positioned in sufficiently close proximity to one or more optical sources that heat generated by the sources or other components is conducted away or heat is provided to the source or other components at a desired efficiency to maintain the sources or other components in the package within a defined temperature range.

In various embodiments, one or more semiconductor laser diodes are packaged in thermal contact with at least a heat pipe evaporator portion within the package and at least part of a heat pipe condenser portion is exposed thermally to the environment external to the package. The design of evaporating and condensing portions of the heat pipe and the relative proximity to the diodes will depend upon a number of factors. For example, heat generated by the laser diode and other devices within the package during operation, the size of the package, the desired operating temperature of the laser diode and the expected range of temperatures external to the package are some of the relevant factors.

In an exemplary embodiment, a planar heat pipe is used within a laser package to provide heat transfer between at least one laser diode to the exterior of the package. In many undersea applications, as well as other applications, the temperature outside of a laser package is almost always lower than the temperature inside the package and the laser. In these applications, a unidirectional heat pipe or other HTC/LTM material can be employed to provide heat transfer out of the package.

The present invention provides optical source package with low thermal impedance that provides for a greater range of operation without the need for active heating and/or cooling devices, such as thermoelectric coolers ("TEC"). For example, commercially available heat pipe can reduce the thermal impedance of a heat sink by approximately an order of magnitude. Thus, the use of heat pipes or other HTC/LTM materials can allow the use of terrestrial optical packages in undersea applications and for application with larger temperature differentials.

A benefit of the present invention is that optical sources that are either passive or active temperature control can be manufactured using the same packaging designs, materials, and process. For example, in actively controlled packages, a TEC can be employed in the package and for actively controlled packages, a heat pipe having the same form factor as the TEC can be used in place of the TEC. In other embodiments, a heat pipe can be provided in the package and coupled to a TEC or other temperature controller external to the package, if active temperature control is required. The use of the same packaging designs, materials, and process provides for manufacturing efficiency and simplified designs.

The optimization and/or elimination of active heating and cooling devices provides optical source packages with lower cost, increased reliability and more efficient power utilization that can provide improved optical system performance. These advantages and others will become apparent from the following detailed description.

BRIEF DESCRIPTION OF THE DRAWINGS

Embodiments of the present invention will now be described, by way of example only, with reference to the accompanying schematic drawings for the purpose of illustrating embodiments only and not for purposes of limiting the same, wherein:

FIGS. 3a–3d illustrate exemplary optical source package embodiments; and,

DESCRIPTION OF THE INVENTION

Figure 1:
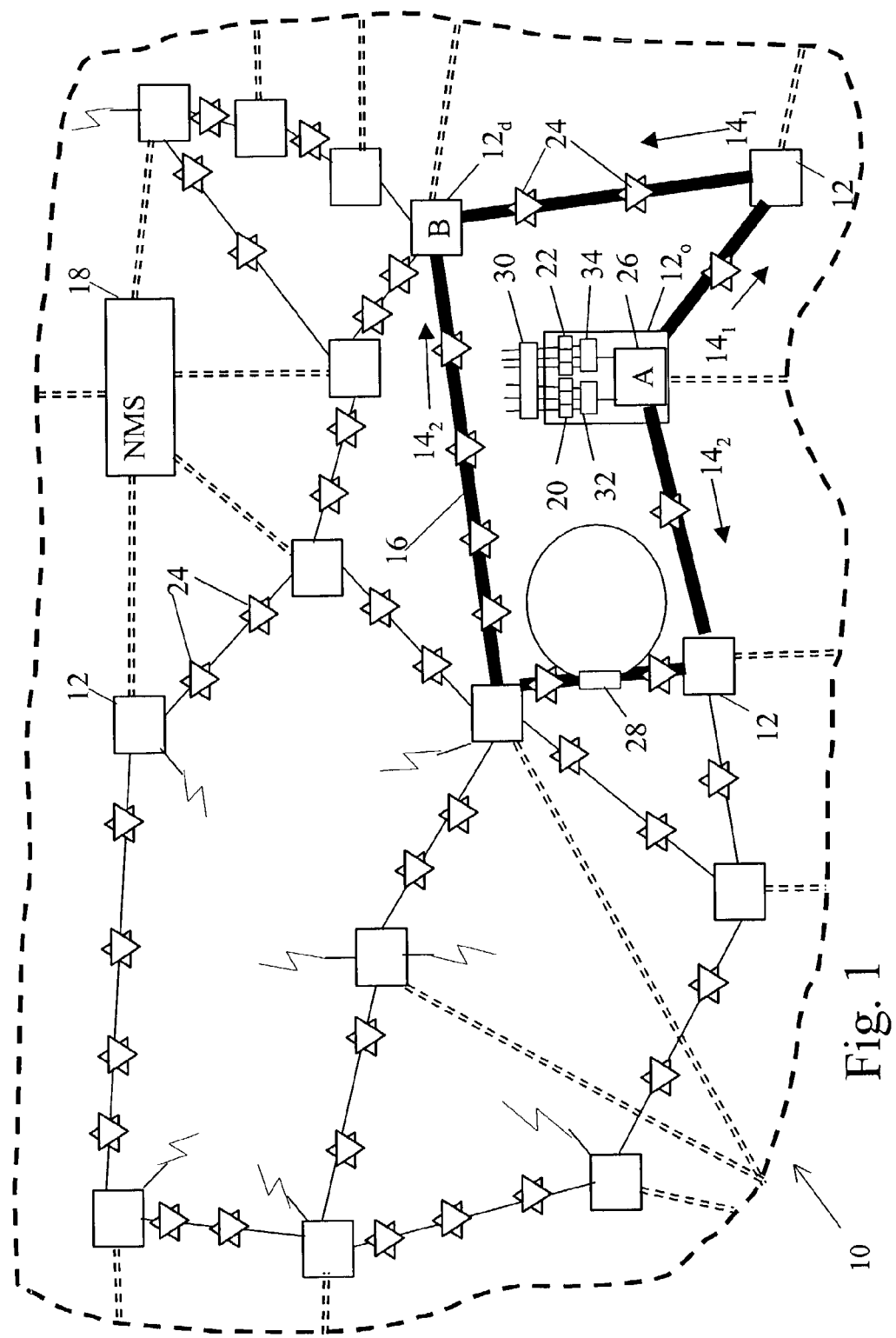
FIGS. 1 and 2 illustrate optical system embodiments.

FIG. 1 illustrates an optical system 10, which includes a plurality of nodes 12 connected by optical communication paths 14. Advantages of the present invention can be realized with many system configurations, topologies, and architectures in terrestrial and/or undersea applications. For example, an all optical network, one or more interconnected point to point optical links (FIG. 2), and combinations thereof can be configured in various topologies, i.e., rings, mesh, etc. to provide a desired network connectivity.

Various systems 10 can support one or more transmission schemes, such as space, time, polarization, code, wavelength and frequency division multiplexing, etc., singly or in combination within a network to provide communication between the nodes 12. The system 10 can include various types of transmission media 16 and be controlled by a network management system 18.

As shown in FIG. 1, optical processing nodes 12 generally can include one or more optical components, such as transmitters 20, receivers 22, amplifiers 24, optical switches 26, optical add/drop multiplexers 28, and interfacial devices 30. For example, in WDM embodiments, the node 12 can include optical switches 26 and interfacial devices 30 along with multiple transmitters 20, receivers 22, and associated equipment, such as processors, monitors, power supplies, system supervisory and network and element management equipment, etc.

The optical processing nodes 12 can be configured via the network management system 18 in various topologies. For example, the deployment of integrated transport optical switches 26, and optical add/drop multiplexers 28 as integrated switching devices in intermediate nodes $12_i$ can provide all-optical interconnections between the transmitters 20 and receivers 22 located in non-adjacent origination and destination nodes, 12, and $12_d$, respectively. The use of integrated transport switching devices in the system 10 in this manner provides for distance independent all-optical networks, sub-networks, and/or nodal connections.

In various network embodiments, multiple paths, e.g., $14_1$ and $14_2$, can be provided between nodes 12. The optical path 14 between adjacent nodes 12 is referred to generally as an optical link. The optical communication path 14 between adjacent optical components, typically optical amplifiers, along the link is referred to generally as a span.

Various guided and unguided transmission media 16, such as fiber, planar, and free space media, can be used to form the optical communication paths 14. The media 16 supports the transmission of information between originating nodes 12, and destination nodes $12_d$ in the system 10. As used herein, the term "information" should be construed broadly to include any type of audio, video, data, instructions, or other signals that can be transmitted.

The transmission media 16 can include one or more optical fibers interconnecting the nodes 12 in the system 10. Various types of fiber, such as dispersion shifted ("DSF"), non-dispersion shifted ("NDSF"), non-zero dispersion shifted ("NZDSF"), dispersion compensating("DCF"), and polarization maintaining ("PMF") fibers, doped, e.g. Er, Ge, as well as others, can be deployed as transmission fiber to interconnect nodes 12 or for other purposes in the system 10. The fiber typically can support either unidirectional or bi-directional transmission of optical signals in the form of one or more information carrying optical signal wavelengths $\lambda_{si}$, or "channels". The optical signal channels in a particular path 14 can be processed by the optical components as individual channels or as one or more wavebands, each containing one or more optical signal channels.

Network management systems ("NMS") 18 can be provided to manage, configure, and control optical components in the system 10. The NMS 18 generally can include multiple management layers, e.g. using a TMN structure, which can reside at one or more centralized locations and/or be distributed among the optical components in the network. The optical components can be grouped logically as network elements for the purposes of network management. One or more network elements can be established at each optical component site in the network depending upon the desired functionality in the network and management system.

The NMS 18 can be connected directly or indirectly to network elements located either in the nodes 12 or remotely from the nodes 12. For example, the NMS 18 may be directly connected to network elements serving as a node 12 via a wide area or data communication network ("WAN" or "DCN", depicted via broken lines in FIG. 1). Indirect connections to network elements that are remote to the DCN can be provided through network elements with direct connections. Mixed data or dedicated supervisory channels can be used to provide connections between the network elements. The supervisory channels can be transmitted within and/or outside the signal wavelength band on the same medium or a different medium depending upon the system requirements.

The optical transmitters 20 transmit information as optical signals via one or more signal channels $\lambda_{si}$ through the transmission media 16 to optical receivers 22 located in other processing nodes 12. The transmitters 20 used in the system 10 generally include an optical source that provides optical power in the form of electromagnetic waves at one or more optical wavelengths. The optical source can include various coherent narrow or broad band sources, such as DFB and DBR lasers, sliced spectrum sources and fiber and external cavity lasers, as well as suitable incoherent optical sources, e.g., LED, as appropriate. The sources can have a fixed output wavelength or the wavelength can be tunable using various feedback and control techniques, such as temperature, current, and gratings or other components or means for varying the resonance cavity of the laser or output of the source.

Information can be imparted to the electromagnetic wave to produce an optical signal carrier either by directly modulating the optical source or by externally modulating the electromagnetic wave emitted by the source. Alternatively, the information can be imparted to an electrical carrier that can be upconverted, or frequency shifted, to an optical signal wavelength $\lambda_{si}$. Electro-optic (e.g., LiNbO$_3$), electro-absorption, other types of modulators and upconverters can be used in the transmitters 20.

In addition, the information can be imparted using various modulation formats and protocols. For example, various amplitude modulation schemes, such as non-return to zero (NRZ), differential encoding, and return to zero (RZ) using various soliton, chirped, and pulse technologies. Various frequency, phase, and polarization modulation techniques also can be employed separately or in combination. One or more transmission protocols, such as SONET/SDH, IP, ATM, Digital Wrapper, GMPLS, Fiber Channel, Ethernet, etc. can be used depending upon the specific network application. It will be appreciated that the transmitters 20 and receivers 22 can use one or more modulation formats and transmission protocols within the network.

The optical receiver 22 used in the present invention can include various detection techniques, such as coherent detection, optical filtering and direct detection, and combinations thereof. The receivers 22 can be deployed in modules that have incorporated wavelength selective demultiplexers to filter a specific channel from a WDM signal or channel demultiplexing can be performed outside of the receiver module. It will be appreciated that the detection techniques employed in the receiver 22 will depend, in part, on the modulation format and transmission protocols used in the transmitter 20.

Generally speaking, N transmitters 20 can be used to transmit M different signal wavelengths to J different receivers 22. Also, tunable transmitters 20 and receivers 22 can be employed in the optical nodes 12 in a network, such as in FIG. 1. Tunable transmitters 20 and receivers 22 allow system operators and network architects to change the signal wavelengths being transmitted and received in the system 10 to meet their network requirements. The transmitters 20 and receivers 22 can be adjusted dynamically using various feedback loops or operated independently and at the same or different power levels.

Figure 2:
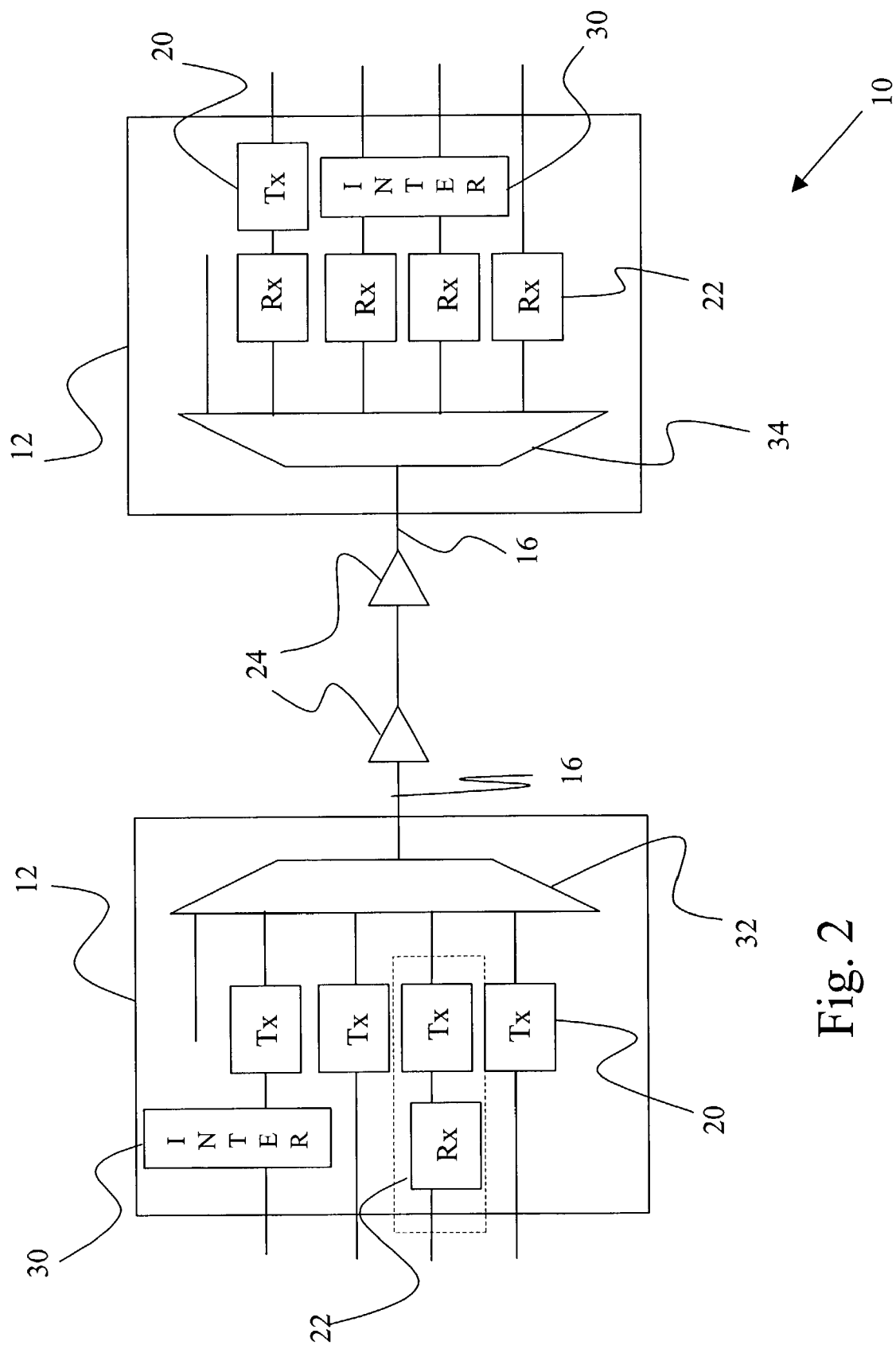

In addition, the transmitters 20 and receivers 22 can include various components to perform other signal processing, such as reshaping, retiming, error correction, differential encoding, protocol processing, etc. using serial and/or parallel techniques. For example, receivers 22 can be connected to the transmitters 20 in back to back configuration as a transponder or regenerator, as shown in FIG. 2. The back-to-back configuration can include various levels of functionality depending upon whether it serves as a 1R repeater (repeat or retransmit), a 2R remodulator (reshape & repeat), or a 3R regenerator (reshape, retime, repeat).

In multiple channel systems, the transmitters 20 and receivers 22 can be operated in a uniform manner or the transmission and reception characteristics of the signal channels can be tailored individually and/or in groups. For example, pre-emphasis, optical and/or electrical pre- and post-dispersion and distortion compensation can be performed on each channel or groups of channels.

In FIG. 2, it will be appreciated that the transmitters 20 and receivers 22 can be used in multiple and single channel systems, as well as to provide short, intermediate, and/or long reach optical interfaces between other network equipment and systems. For example, transmitters 20 and receivers 22 deployed in a WDM system can be included on a module that includes standardized interface receivers and transmitters, respectively, to provide communication with interfacial devices 30, as well as other transmission and processing systems. In addition, the transmitters 20 and receivers 22 can be integrated into the input and output interfaces on interfacial devices 30.

The optical amplifiers 24 can be deployed periodically along optical links 15 to overcome attenuation that occurs in a span of transmission media 16. In addition, optical amplifiers 24 can be provided proximate to other optical components, for example, at the node 12 as booster/post-amplifiers and/or pre-amplifiers to provide gain to overcome component losses. The optical amplifiers 24 can include doped (e.g. Er, other rare earth elements, etc.) and non-linear interaction (e.g., Raman, Brillouin, etc.) fiber amplifiers that provide stimulated amplification. Various amplifiers and control schemes can be used in the present invention, such as those described in U.S. Pat. Nos. 6,115,174, 6,236,487, 6,344,922, 6,344,925, and 6,356,383, which are incorporated herein by reference.

Other types of optical amplifiers, such as semiconductor amplifiers, can be used in lieu of, or in combination with the fiber amplifiers. Two or more amplifiers 24 may be co-located and concatenated to provide additional flexibility. Each optical amplifiers 24 can include one or more serial and/or parallel stages that provide localized gain at discrete sites in the network and/or gain that is distributed along the transmission media 16. One or more other functions can be performed between the amplifiers and/or stages of the amplifiers. For example, optical regeneration, dispersion compensation, isolation, filtering, add/drop, switching, etc. can be included at a site along with the optical amplifiers 24.

Various types of optical switching devices, both optical switches 26 and OADMs 28, can be integrated into the nodes 12 and the all-optical networking functionality of the devices can be used to establish distance independent networks. The switching devices allow for integrated optical transport switching, adding, dropping, and/or termination of signal channels from multiple paths 14 entirely in the optical domain. The switching device eliminate the need for receivers 22 and transmitters 20 to perform electrical conversions, as required when using interfacial devices 30, merely to pass the information through intermediate nodes 12$i$. As such, signal channels can optically pass through intermediate nodes 12$i$ between the origin nodes 12$_o$ and destination nodes 12$d$ bypassing the need for transmitters 20 and receivers 22 at the intermediate nodes 12$i$. In this manner, the switching devices provide transparency through nodes that allows all-optical express connections to be established between non-adjacent origin and destination nodes in a network.

The signal channels optically passing through the switching devices can be distributed from a common path to multiple diverse paths, as well as combined from multiple diverse paths onto a common path. It will be appreciated that signal channels that are switched onto a common path by the switching devices from different paths can have different properties, such as optical signal to noise ratio. Conversely, signal channels entering the switching devices from a common path and exiting the devices via different paths may require that the signal channels exit with different properties, such as power level. As such, signal channels may have different span loss/gain requirements or tolerances within the link 15.

The optical switches 26 and OADMs 28 can be configured to process individual signal channels or signal channel groups or wavelength bands including one or more signal channels. The switching devices also can include various wavelength selective or non-selective switch elements, combiners 32, and distributors 34. The transmitters 20 and receivers 22 can be configured to transmit and receive signal channels dynamically through the switch elements or in a dedicated manner exclusive of the switch elements using various combiners 32 and distributors 34. The OADMs can include channel reusable and non-reusable configurations. Similarly, the switching devices can be configured to provide multicast capability, as well as signal channel terminations.

The switching devices can include various configurations of optical combiners 32 and distributors 34, such as channel multiplexers and demultiplexers, passive splitters and couplers described below, used in combination with various switch elements configured to pass or block the signals destined for the various other nodes 12 in a selective manner. The switching of the signals can be performed at varying granularities, such as line, group, channel, and packet switching, depending upon the degree of control desired in the system 10.

The switch element can include wavelength selective or non-selective on/off gate switch elements, as well as variable optical attenuators having suitable extinction ratios. The switch elements can include single and/or multiple path elements that use various techniques, such as polarization control, interferometry, holography, etc. to perform the switching and/or variable attenuation function. The switching devices can be configured to perform various other functions, such as filtering, power equalization, dispersion compensation, telemetry, channel identification, etc., in the system 10.

Various two and three dimensional non-selective switch elements can be used in present invention, such as mechanical line, micro-mirror and other micro-electro-mechanical systems ("MEMS"), liquid crystal, holographic, bubble, magneto-optic, thermo-optic, acousto-optic, electro-optic (LiNbO$_3$), semiconductor, erbium doped fiber, etc. Alternatively, the switch elements can employ fixed and tunable wavelength selective multi-port devices and filters, such as those described below. Exemplary switching devices are described in PCT Application No. PCT/US00/23051, which is incorporated herein by reference.

The interfacial devices 30 may include, for example, protocol and bit rate independent devices, such as optical switches and/or protocol and bit rate dependent electrical switch devices, such as IP routers, ATM switches, SONET add/drop multiplexers, etc. that operate at or between various networking layers (e.g., 1, 2, 3). The interfacial devices 30 can be configured to receive, convert, and provide information in one or more various protocols, encoding schemes, and bit rates to one or more transmitters 20, and perform the converse function for the receivers 22. The interfacial devices 30 also can be used as an input/output cross-connect switch or automated patch panel and to provide protection switching in various nodes 12 depending upon the configuration. The interfacial devices 30 can be electrically connected to the transmitters 20 and receivers 22 or optically connected using standard interface and/or WDM transmitters and receivers, as previously described.

Optical combiners 32 can be provided to combine optical signals from multiple paths into a multiple channel signal on a common path, e.g. fiber, such as from multiple transmitters 20 or in optical switching devices. Likewise, optical distributors 34 can be provided to distribute one or more optical signals from a common path to a plurality of different optical paths, such as to multiple receivers 22 and/or optical switching devices.

The optical combiners 32 and distributors 34 can include wavelength selective and non-selective ("passive") fiber, planar, and/or free space devices, as well as polarization sensitive devices. For example, one or more multi-port devices, such as passive, WDM, and polarization couplers/splitters having various coupling/splitting ratios, circulators, dichroic devices, prisms, diffraction gratings, arrayed waveguides, etc. can be employed used in the combiners 32 and distributors 34. The multi-port devices can be used alone, or in various combinations of filters, such as tunable or fixed, high, low, or band pass or band stop, transmissive or reflective filters, including Bragg gratings, Fabry-Perot, Mach-Zehnder, and dichroic filters, etc. Furthermore, one or more serial or parallel stages incorporating various multi-port device and/or filter combinations can be used in the combiners 32 and distributors 34 to multiplex, demultiplex, and multi-cast signal wavelengths $\lambda_i$ in the optical systems 10.

Optical systems of the present invention include optical and/or electrical devices and/or subassemblies, such as lasers and other optical sources, data processing chips etc., that are packaged, or housed, in a structure employing a high thermal conductivity, low effective thermal mass ("HTC/LTM") material, such as a heat pipe. The HTC/LTM material provides a low thermal impedance and is positioned proximate to one or more optical sources to conduct heat to or from the devices at a desired efficiency, so as to maintain the device within a defined temperature range.

FIGS. 3a–3d show exemplary embodiments of the present invention as applied to an optical source package 40. The package 40 houses an optical source 42 that is supplied with electrical power and coupled optically to an output waveguide 44, such as an optical fiber, via an optical coupling device 46. The package 40 can be hermetically sealed and constructed using standard packaging material as is known in the art. Also, the package 40 can have a standard pin arrangement, e.g., 300 pin MSA, for connection to a circuit board. The optical source 42 can include one or more surface or side emitting semiconductor laser diodes and associated control optics and electronics, as well as light emitting diodes and other sources.

The coupling device 46 can include various optical and mechanical coupling devices used to couple the output of the optical source 42 into the waveguide 44. For example, one or more free space lenses 48 can be used to focus the output optical power from the optical source 42 into the waveguide 44 or a lensed fiber 49 can be used, as shown in FIGS. 3b and 3c, respectively. Various types of optical packages, lenses, etc. are generally well known in the art. See, for example, U.S. Pat. Nos. 4,803,689; 5,430,820; 5,436,920; 5,446,750; and, 5,446,816, which are incorporated herein by reference.

In the present invention, the optical package 40 also include a high thermal conductivity, low effective thermal mass ("HTC/LTM") member 50 that is designed to transfer heat into and/or out of the optical package 40 to maintain the optical source 42 and/or other components within a prescribed temperature range. HTC/LTM member 50 can be designed to transfer generated by the optical source 42 and/or other components within the package 40 out of the package 40, as well as heat to optical source 42 and/or other components within the package 40 depending upon thermal conditions outside the package 40.

The prescribed temperature range will depend upon the desired operating conditions for the system 10 and the optical source 42 and other component specifications. For example, equipment used in terrestrial deployed systems generally will have to operate over a wider external/ambient temperature ranges than equipment deployed undersea and will experience larger temperature differentials between the operating temperature of the equipment and external/ambient conditions. In addition, the stability of different types of optical sources 42 can vary differently over a range of temperatures.

The HTC/LTM member 50 employs material that provide a low thermal impedance that allows for effective heat transfer with a low thermal mass for retaining heat in the package 40. The HTC/LTM member 50 can be directly or indirectly in contact with the package 40 and/or the member 50 can form an integral portion of the package 40.

In various embodiments, the HTC/LTM member 50 is a heat pipe that facilitates the transfer of heat generated by the optical source 42 out of the package 40 to maintain the temperature within the package 40 within an operating range. Heat pipes provide high thermal conductivity and low effective thermal mass generally by transferring heat via an evaporation and condensation mechanism.

Heat pipes generally include at least one evaporating portion 52 and at least one condensing portion 54. While it will be appreciated that heat pipes that include more than one evaporating and/or condensing portions may be designed, the exemplary description will be made to a heat pipe having one evaporating and one condensing portion.

The components of a heat pipe generally include a container, a working fluid, and a wick or capillary structure; the choice of material for each will depend upon the operating conditions in which the heat pipe is used. For example, working fluids such as ammonia, acetone, methanol, ethanol, and combinations thereof may be useful in optical system applications, which typically have operating ranges of 0 to 65° C. The wick or capillary structure can be made of various materials, such as metals, ceramics, carbons, etc., in various forms, such as foams, fibers, particles, etc.

Heat pipes are commercially available from various vendors. Information on heat pipes can be found in numerous sources, such as "What is a Heat Pipe?" by Shankara Narayanan published by Chemical Engineer's Resource Page at www.cheresources.com, which is incorporated herein by reference.

The optical source 42 generally can be mounted directly or indirectly via a high thermal conductivity material to the evaporating portion 52 of the heat pipe 50 to allow for flow of heat from the optical source 42 out of the package. In addition, a condensing portion 54 of the heat pipe 50 is positioned external to and/or in thermal contact with the package 40 to allow heat to exit the package 40 via the condensing portion 54. The heat pipe 50 can employ a common design for the evaporating and condensing portions, such that the evaporating and condensing portions of the heat pipe would be established based on the temperature differential inside and outside of the package 40. Alternatively, the design can be optimize for heat flow in one direction.

The design of evaporating and condensing portions of the heat pipe and the proximity to the optical sources 42 will depend upon a number of factors. For example, heat generated by the optical sources 42 and other devices within the package during operation, the size of the package, the desired operating temperature of the optical sources 42 and the expected range of temperatures external to the package are some of the relevant factors.

The present invention provides an optical source package that provides for operation over a wider temperature range without the need for active heating and/or cooling devices, such as thermo-electric coolers ("TEC"), then was possible in the prior art. For example, prior art passively cooled devices typically could only operate with temperature differentials less than 20° C. and often time less than 20° C. Whereas, the present invention can support temperature differentials in excess of 40° C., which allows for increased flexibility in package design and the use of devices that dissipate higher power.

The elimination of active heating and cooling devices provides optical source packages with lower cost, increased reliability and more efficient power utilization that can provide improved optical system performance. The additional flexibility in the design of the optical source package can result in additional savings and flexibility in applications employing passively cooled optical sources.

As shown in FIGS. 3a–3d, the HTC/LTM member 50 could be used to provide the required thermal contact with the package or external to the package and as a support structure to provide additional flexibility in the package design. A heat pipe is used as HTC/LTM member 50 and positioned at least partially within the package 40 to passively conduct heat to/from the optical source 42. The package 40 has an output aligned to allow light emitted by the laser diode to exit the package 40 via the coupling device 46. The waveguide can include a wavelength reflector 56, such as a fiber Bragg grating, to provide an external cavity for controlling the emission wavelengths of the lasers.

FIG. 3a shows an embodiment of the present invention in which the package 40 includes the optical source 42 mounted directly or indirectly on the HTC/LTM member 50 via a thermal conductor, such as a conductive pad or grease. In the case of a heat pipe, the evaporating portion 52 is proximate the source 42 and the condensing portion 54 is proximate or integral with the package 40. The source 42 is positioned within the package 40, such that the light emitted by the source 42 exits the package via coupling device 46 and enters the output waveguide 44.

FIG. 3b shows an embodiment similar to 3a, but with a TEC or other active heat transfer element 60 positioned between the HTC/LTM member and the package 40.

The FIG. 3b embodiment also includes a wavelength reflector 56, e.g., fiber Bragg grating, disposed in the waveguide 44 to create an external cavity with the source 42. FIG. 3b also the use of two discrete lenses 48 as part of the coupling device 46.

FIG. 3c depicts the use of the present invention in cooperation with TEC or Peltier elements 60 in traditional actively cooled laser package designs. FIG. 3c also shows an embodiment similar that employs a lensed fiber, which can be used in lieu of, or in addition to, one or more discrete lenses.

FIG. 3d shows the HTC/LTM member 50 in combination with a traditional heat transfer device 62, such as metal block of WCu, Kovar, Cu, etc. While the embodiment in FIG. 3d shows the heat transfer device 62 between the optical source 42 and the HTC/LTM member 50, the HTC/LTM member 50 could be between the heat transfer device 62 and the optical source 42.

The optical sources 42 packaged according to the present invention can be employed in submerged optical system applications and other applications where the ambient temperatures surrounding optical source package vary within the operating range of the heat pipe. In many embodiments, the temperature external to the optical source package and the source itself will almost always be higher than the temperature external to the package. In these applications, the HTC/LTM member 50 can be optimized to transfer heat out of the package 40 as a unidirectional heat transfer diode.

Figure 4A:
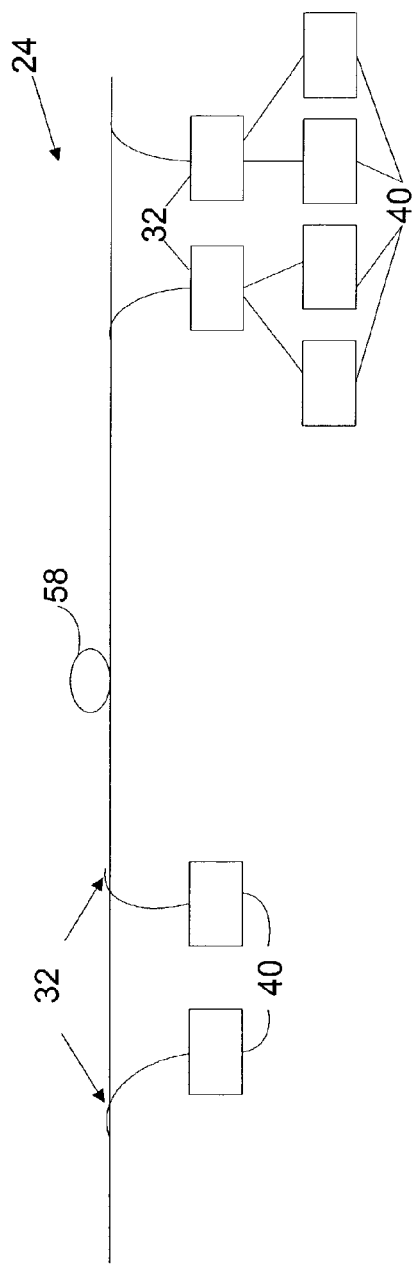
FIGS. 4a & 4b illustrate exemplary optical amplifier and transmitter embodiments, respectively.

FIG. 4a shows an exemplary application of the present invention, in which the optical package 40 could be employed in a optical amplifier 24 for use an optical pump source for a Raman, erbium, other type of optically pumped amplifiers. The optical amplifier 24 will generally include one or more optical source package 40 that will provide optical "pump" power to an amplifying medium 58. The amplifier 24 can have numerous embodiments, examples of which have been described above.

Figure 4B:
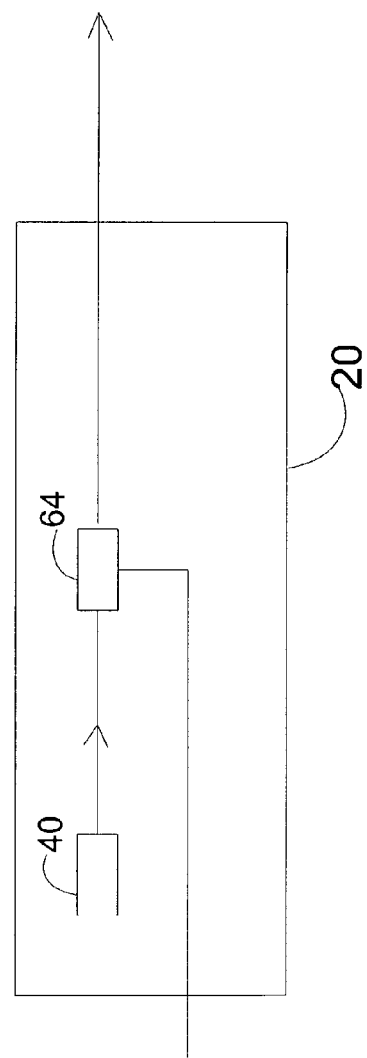

FIG. 4b shows an exemplary application of the present invention, in which the optical source package 40 is used in a transmitter 20. The optical source package 40 is used in these embodiments to provide optical "signal" power to carry information through the system 10. The transmitter 20 can have numerous embodiments, such as those described above. For example, the optical source package 40 can provide a continuous wave or pulses to an electo-optical converter 64, which can impart information from an electrical signal onto an optical wavelength for transmission or otherwise. Alternatively, the optical source 42 can be directly modulated to convert the information from electrical to optical form as described above.

In application, HTC/LTM materials of the present invention allow greater design and application flexibility in the use of passively cooled, optical packages. For example, the increased capability can be used in shallow water and/or high laser power applications, where temperature differences between the temperature of a laser within a package and the ambient temperature outside of the package can exceed 25° C.

A benefit of the present invention is that optical sources that are either passive or active temperature control can be manufactured using the same packaging designs, materials, and process. For example, in actively controlled packages, a TEC can be employed in the package and for actively controlled packages, a heat pipe having the same form factor as the TEC can be used in place of the TEC. In other embodiments, a heat pipe can be provided in the package and coupled to a TEC or other temperature controller external to the package, if active temperature control is required. The use of the same packaging designs, materials, and process provides for manufacturing efficiency and simplified designs.

While the present invention has been described primarily with respect to optical sources, it can be implemented with other components in a system. For example, it can be used with data processing devices, e.g. forward error correction and protocol processing chips, as well as at a module, shelf and rack level. In other applications, the present invention can be used not to eliminate or cooperate with an active temperature controller, such as a TEC, but to redistribute heat within a module, shelf, or rack. Heat redistribution via the HTC/LTM member 50 can facilitate more efficient natural and/or forced convection cooling of the equipment.

It will be appreciated that the present invention provides for optical devices and systems with increase reliability and performance. Those of ordinary skill in the art will further appreciate that numerous modifications and variations that can be made to specific aspects of the present invention without departing from the scope of the present invention. It is intended that the foregoing specification and the following claims cover such modifications and variations.

What is claimed is:

1. An optical system comprising:
   at least one first transmitter;
   at least one first receiver; and,
   a first optical amplifier configured to amplify optical signals being transmitted from said at least one first transmitter to said at least one first receiver, said first optical amplifier includes at least one optical source in a package including a HTC/LTM member positioned partially within said package to passively conduct heat to/from said optical source.

2. The system of claim 1, wherein said first optical amplifier is a submerged optical amplifier.

3. The system of claim 1, wherein said first optical amplifier is at least one of a Raman amplifier and an erbium doped fiber amplifier.

4. The system of claim 3, wherein said optical source is a semiconductor laser diode designed to provide optical power to said optical amplifier.

5. An apparatus comprising:
   an optical source housed in a package having at least an output aligned to allow optical power from said optical source to exit said package; and,
   a HTC/LTM member positioned partially within said package to passively conduct heat to/from said optical source.

6. The apparatus of claim 5, wherein said HTC/LTM member is a heat pipe.

7. The apparatus of claim 6, wherein said heat pipe is configured to maintain the temperature of the optical source within a prescribed temperature range.

8. The apparatus of claim 7, wherein said heat pipe includes a working fluid selected to maintain the temperature within the package to within the prescribed temperature range.

9. The apparatus of claim 8, wherein said working fluid is selected from the group consisting of ammonia, acetone, methanol, ethanol and combinations thereof.

10. The apparatus of claim 5, wherein said optical source is a semiconductor laser diode.

11. The apparatus of claim 5, wherein said HTC/LTM member passively conducts heat via an evaporation and condensation mechanism.

12. The apparatus of claim 5, wherein said HTC/LTM member is thermally coupled to a temperature controller external to said package.

13. The apparatus of claim 12, wherein said temperature controller is a thermo-electric cooler.

14. The apparatus of claim 5, wherein said package is configured to accommodate HTC/LTM members and temperature controller that have the same form factor.

15. A method of controlling the temperature of an optical source comprising:
- providing an optical source in a package having at least an output aligned to allow light from said optical source to exit the package; and,
- positioning a HTC/LTM member partially within said package to passively conduct heat to/from said optical source and maintain the optical source with a prescribed temperature range during operation.

16. The method of claim 15, wherein said positioning a HTC/LTM member includes positioning a HTC/LTM member partially within said package to passively conduct heat via an evaporation and condensation mechanism.

17. The method of claim 15, wherein said positioning including coupling a temperature controller to the HTC/LTM member external to the package to provide active temperature control on the optical source.

\* \* \* \* \*